(12) United States Patent
Lee et al.

(10) Patent No.: US 11,804,647 B2
(45) Date of Patent: Oct. 31, 2023

(54) BRIDGE PRINTED CIRCUIT BOARD, MILLIMETER-WAVE ANTENNA DEVICE AND ELECTRONIC DEVICE

(71) Applicant: LANNER ELECTRONICS INC., New Taipei (TW)

(72) Inventors: Rui-Xuan Lee, Taoyuan (TW); Yun-Hung Chen, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 28 days.

(21) Appl. No.: 17/842,485

(22) Filed: Jun. 16, 2022

(65) Prior Publication Data
US 2023/0187812 A1    Jun. 15, 2023

(30) Foreign Application Priority Data
Dec. 15, 2021 (TW) .................................. 110146985

(51) Int. Cl.
*H01Q 1/22* (2006.01)
*H01Q 1/24* (2006.01)
*H01L 23/48* (2006.01)
*H01L 23/66* (2006.01)
*H01Q 23/00* (2006.01)

(52) U.S. Cl.
CPC ......... *H01Q 1/2283* (2013.01); *H01L 23/481* (2013.01); *H01L 23/66* (2013.01); *H01Q 1/243* (2013.01); *H01Q 23/00* (2013.01); *H01L 2223/6677* (2013.01)

(58) Field of Classification Search
CPC ...... H01Q 23/00; H01Q 1/243; H01Q 1/2283; H01L 2223/6677; H01L 23/66; H01L 23/481
See application file for complete search history.

*Primary Examiner* — Graham P Smith

(57) ABSTRACT

A bridge PCB is disclosed, which comprises: a substrate, a first HF connector, a second HF connector, a first antenna connector, and a first electrical connector, of which a millimeter-wave antenna module is connected with the first antenna connector that is disposed at outside of an electronic device. On the other hand, the first HF connector is coupled to a main board in the electronic device through a first signal transmission cable, and the second HF connector is coupled to the main board through a second signal transmission cable. By such arrangements, the millimeter-wave antenna module is not influenced by the case of an electronic device during the transceiving of millimeter-wave signal. Therefore, there is no need to use a particularly-designed flexible PCB to bridge the mobile communication signal processor and the millimeter-wave antenna module.

20 Claims, 15 Drawing Sheets

BRIDGE PRINTED CIRCUIT BOARD, MILLIMETER-WAVE ANTENNA DEVICE AND ELECTRONIC DEVICE

BACKGROUND OF THE INVENTION

1. Field of the Invention

The present invention relates to the technology field of antenna devices, and more particularly to a bridge printed circuit board for coupled between a wireless modem device that is integrated in an electronic device and a millimeter-wave antenna device that is located outside of the electronic device.

2. Description of the Prior Art

Since the use of streaming media service, cloud storage and AIoT is becoming increasingly commonplace in people live, bandwidth and transmission speed of the wireless network are both continuously moved forward so as to get significant enhancement. Recently, IEEE Communications Society has sequentially proposed 5G and 6G cellular communication frameworks for satisfying the requirements of high speed wireless transmission in the further.

Nowadays, 5G cellular communication technology is positioned to address the demands and business contexts of 2021 and beyond. It has potential to enable a fully mobile and connected society and to empower socio-economic transformations in a countless number of ways, many of which are unimagined, including those for productivity, sustainability and well-being. Accordingly, there are various network appliances integrated with 5G wireless module developed and provided. For example, FIG. 1 shows a stereo diagram of a network appliance. As FIG. 1 shows, the network appliance 1a is integrated with a wireless modem device (chipset) 12a and a millimeter-wave antenna module 11a therein, such that the network appliance 1a is allowed to bridge a mobile communication signal (e.g., 4G/5G signal) and a Wi-Fi signal. Furthermore, FIG. 2A illustrates a first stereo diagram of the millimeter-wave antenna module, and FIG. 2B shows a second stereo diagram of the millimeter-wave antenna module. According to FIG. 1, FIG. 2A and FIG. 2B, it is found that the millimeter-wave antenna module 11a is the mmWave Antenna Module QTM525 proposed by Qualcomm company, which comprises: an electrical connection interface 111a and a wireless transceiver circuit enclosed in an encapsulation body 110a, of which the wireless transceiver circuit consists of a 5G transceiver, a power management chip, a radio frequency (RF) front end unit, and a phase-controlled antenna array.

As described in more detail below, there is a flexible printed circuit board (PCB) 13a developed. The flexible PCB 13a is also integrated in the network appliance 1a, so as to be coupled between the millimeter-wave antenna module 11a and the wireless modem device (chipset) 12a. As FIG. 1, FIG. 2A and FIG. 2B show, the flexible PCB 13a has a first electrical connection interface 131a and a second electrical connection interface 132a, of which the first electrical connection interface 131a is coupled to the electrical connection interface 111a of the millimeter-wave antenna module 11a, and the second electrical connection interface 132a is coupled to the wireless modem device 12a.

However, according to practical experiences, the network appliance 1a having the wireless modem device (chipset) 12a and the millimeter-wave antenna module 11a exhibits many drawbacks in practical application. The drawbacks are summarized as follows:

(1) The size and appearance of the flexible PCB 13a is particularly designed, so as to make the flexible PCB 13a can be successfully integrated into the case of the network appliance 1a. In other words, for being successfully integrated into other difference network appliances, the flexible PCB 13a must be re-designed in the size and appearance thereof. As a result, to design various types of flexible PCBs 13a cause the manufacturing cost of the network appliances rise.

(2) The millimeter-wave antenna module 11a is the mmWave Antenna Module QTM525 proposed by Qualcomm company. According to practical experiences, mmWave wireless signal is easily blocked by the metal-made case of the network appliance 1a. Accordingly, for making the millimeter-wave antenna device 11a successfully transmit and receive mmWave wireless signal, the case of the network appliance 1a is therefore made by plastic, glass or ceramics instead of metal. However, only the case made by high thermal conductivity metal can exhibit the most outstanding heat dissipation performance, thereby preventing the network appliance 1a from thermal shootdown.

According to the above descriptions, it is understood that there is still room for improvement in the millimeter-wave antenna module 11a and the wireless modem device (chipset) 12a. In view of this fact, inventors of the present application have made great efforts to make inventive research and eventually provided a bridge printed circuit board for coupled between a wireless modem device that is integrated in an electronic device and a millimeter-wave antenna device that is located outside of the electronic device.

SUMMARY OF THE INVENTION

The primary objective of the present invention is to disclose a bridge printed circuit board (PCB), which is used in an electronic device for making a wireless modem device to be coupled to a millimeter-wave antenna module. The bridge PCB comprises: a substrate, a first HF connector, a second HF connector, a first antenna connector, and a first electrical connector. According to the present invention, the millimeter-wave antenna module is connected with the first antenna connector, so as to be disposed on an outer surface of the electronic device. By such arrangements, the millimeter-wave antenna module is not influenced by the case of the electronic device during the transceiving of millimeter-wave signal. On the other hand, the first HF connector is coupled to a main board in the electronic device through a first signal transmission cable, and the second HF connector is coupled to the main board through a second signal transmission cable. By such arrangement, there is no need to use a particularly-designed flexible PCB to bridge between the wireless modem device and the millimeter-wave antenna module.

For achieving the primary objective mentioned above, the present invention provides an embodiment of the bridge printed circuit board, which is adopted for being coupled between a wireless modem device that is accommodated in a case of an electronic device and a millimeter-wave antenna module that is disposed at outside of the electronic device, and comprising:

a substrate, being provided with a first component disposing region, a second component disposing region and a third component disposing region on a first surface thereof, and having a fourth component disposing region on a second surface thereof; wherein there are a first signal via, a second signal via, a third signal via, a fourth signal via, a first power via, and a second power via penetrating the substrate;

a first signal transmission line, being formed on the second surface of the substrate, and being coupled to the third signal via and the first signal via;

a second signal transmission line, being formed on the second surface of the substrate, and being coupled to the third signal via and the second signal via;

a power transmission line, being formed on the second surface of the substrate, and being coupled to the first power via and the second power via;

a first high-frequency (HF) signal transmission connector, being disposed in the first component disposing region, and having a first HF transmission terminal plugged in the first signal via, so as to be further coupled to the first signal transmission line through the first signal via;

a second HF signal transmission connector, being disposed in the second component disposing region, and having a second HF transmission terminal plugged in the second signal via, so as to be further coupled to the second signal transmission line through the second signal via;

a first signal transmission connector, being disposed in the fourth component disposing region, and having a power transmission terminal plugged in the first power via; and a first antenna connector, being disposed in the third component disposing region, and having a power terminal, a first HF terminal and a second HF terminal plugged in the second power via, the third signal via and the fourth signal via, respectively;

wherein the wireless modem device accommodated in the case of the electronic device is successfully coupled to the millimeter-wave antenna module through the bridge printed circuit board by connecting the first antenna connector to a second antenna connector of the millimeter-wave antenna module, connecting the first signal transmission connector to a second signal transmission connector of a signal transmission cable, connecting a third signal transmission connector of the signal transmission cable to a main board accommodated in the case of the electronic device, connecting the first HF signal transmission connector to a third HF signal transmission connector of a first HF transmission cable, connecting a fourth HF signal transmission connector of the first HF transmission cable to the wireless modem device accommodated in the case of the electronic device, connecting the second HF signal transmission connector to a fifth HF signal transmission connector of a second HF transmission cable, and connecting a sixth HF signal transmission connector of the second HF transmission cable to the wireless modem device accommodated in the case of the electronic device.

In one embodiment, there are further a plurality of first vias and a plurality of second vias penetrating the substrate.

In one embodiment, the first surface of the substrate is formed with a first ground layer connected with the first vias and a second ground layer connected with the second vias thereon.

In one embodiment, the first antenna connector is accommodated in a grounding housing, and the grounding housing contact with the first ground layer and the second ground layer by a bottom side thereof.

In one embodiment, a first amount of said first vias are arranged to surround the first signal transmission line, a second amount of said first vias are arranged to surround the second signal transmission line, a third amount of said first vias are arranged to surround the first component disposing region, and a fourth amount of said first vias are arranged to surround the second component disposing region.

In one embodiment, the first antenna connector comprises a plurality of terminals including said power terminal, said first HF terminal and said second HF terminal, of which a part of the plurality of terminals contact with the first ground layer, and the other part of the plurality of terminals contact with the second ground layer.

In one embodiment, the first signal via, the second signal via, the third signal via, the fourth signal via are all a plating through hole (PTH).

Moreover, the present invention also provides a millimeter-wave antenna device, which is adopted for being disposed at outside of an electronic device, being coupled to a wireless modem device that is accommodated in a case of the electronic device through a first high-frequency (HF) transmission cable and a second HF transmission cable, and being coupled to a main board accommodated in the case through a signal transmission cable; characterized in that the millimeter-wave antenna device comprises at least one millimeter-wave antenna module and at least one the foregoing bridge printed circuit board of the present invention.

In one embodiment, the millimeter-wave antenna device further comprises a housing case for accommodating the bridge printed circuit board and the millimeter-wave antenna module, and there is at least one supporting member disposed in the housing case to support the bridge printed circuit board. Moreover, there is at least one first opening formed on one surface of the housing case, and the case is also provided with at least one second opening on one surface thereof, such that the first HF transmission cable, the second HF transmission cable and the signal transmission cable pass through the first opening so as to contact with the bridge printed circuit board, and also pass through the second opening so as to contact with the wireless modem device and the main board.

Moreover, the present invention further provides an electronic device, which comprises a case that is accommodated a main board and a wireless modem device therein, characterized in that the electronic device further has the foregoing millimeter-wave antenna device that is arranged for being disposed at outside of an electronic device, being coupled to the wireless modem device through a first high-frequency (HF) transmission cable and a second HF transmission cable, and being coupled to the main board through a signal transmission cable.

In one embodiment, the electronic device is a network appliance selected from a group consisting of Wi-Fi router, network switch, server computer, NB-IoT gateway, and network backup device.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a bridge printed circuit board, a millimeter-wave antenna device and an electronic device according to the present invention, embodiments of the present invention will be described in detail with reference to the attached drawings hereinafter.

Figure 1:
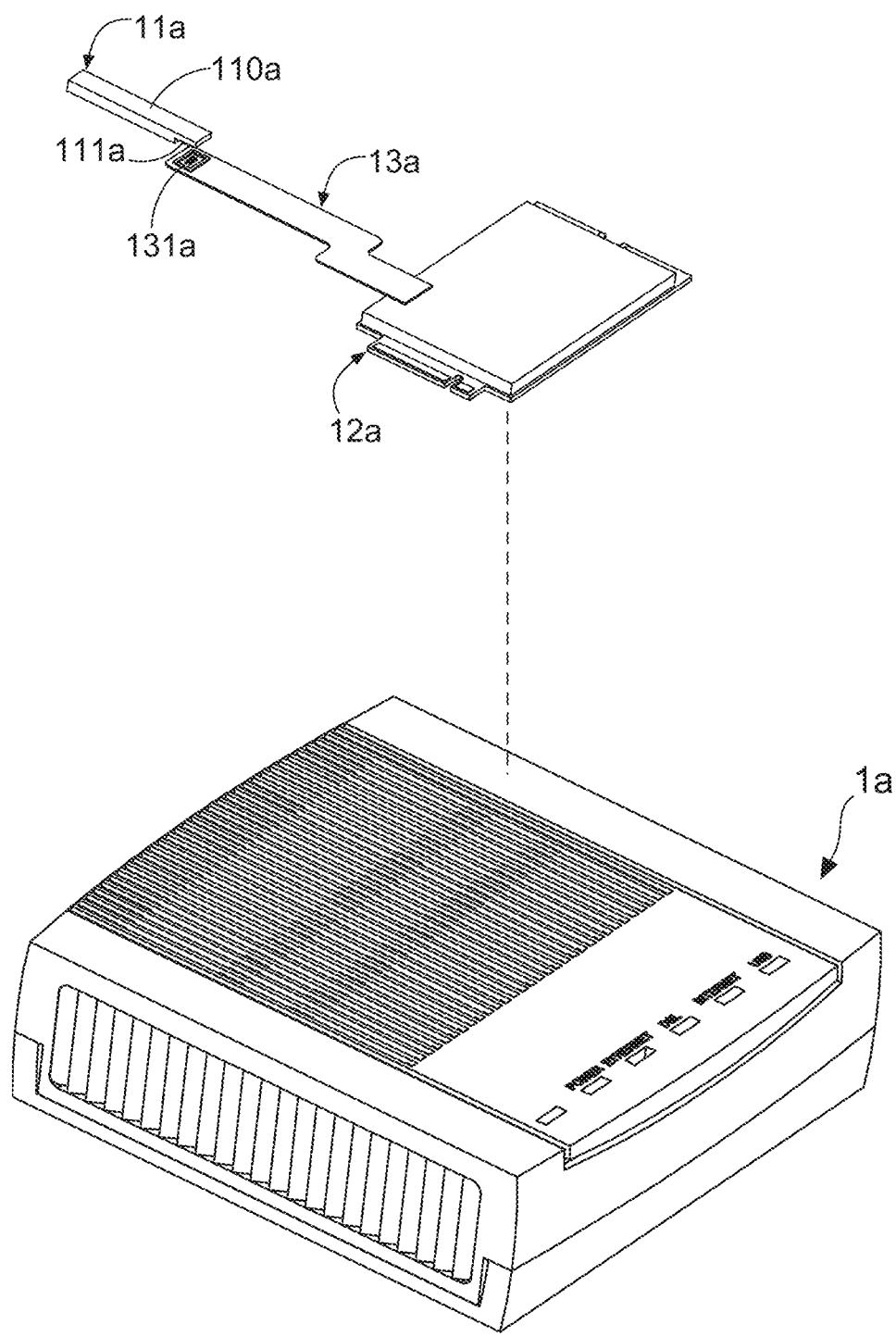
FIG. 1A shows stereo diagram of a network appliance.
Figure 2A:
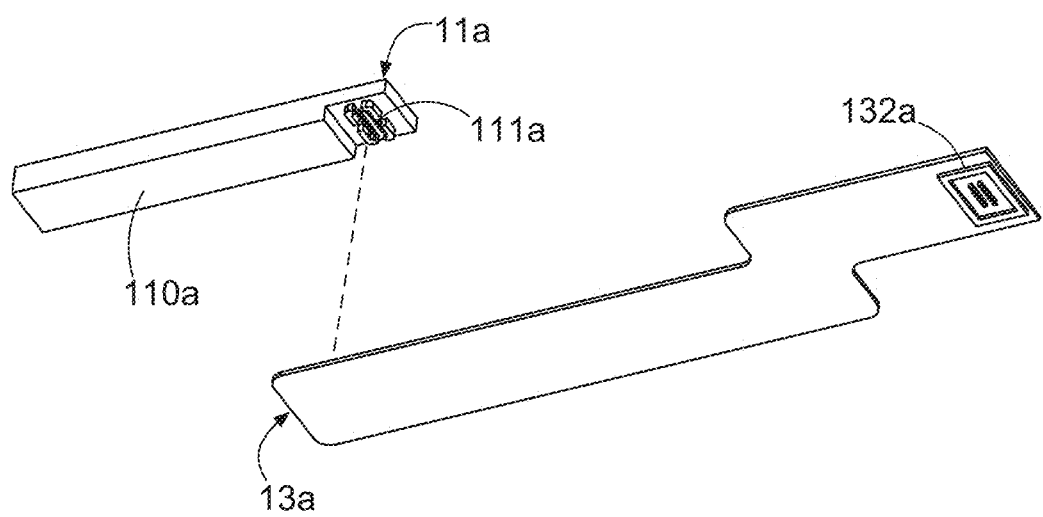
FIG. 2A shows a first stereo diagram of the millimeter-wave antenna device.
Figure 2B:
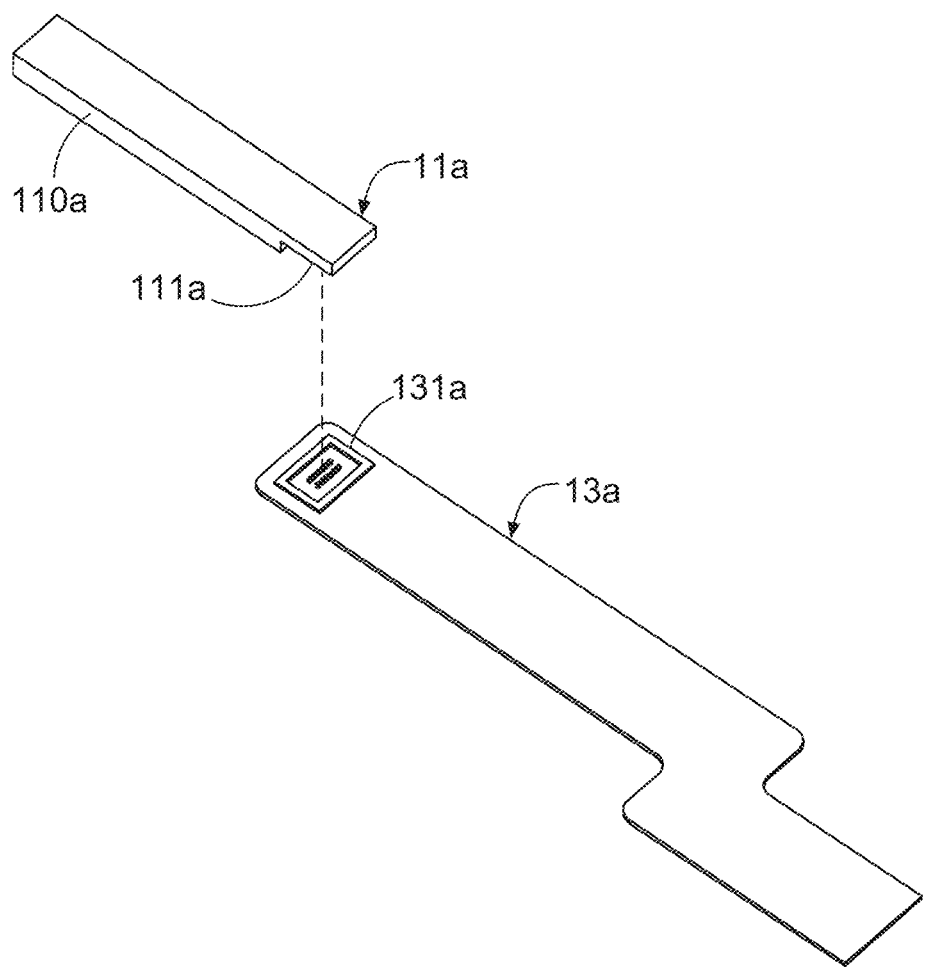
FIG. 2B shows a second stereo diagram of the millimeter-wave antenna device.
Figure 3A:
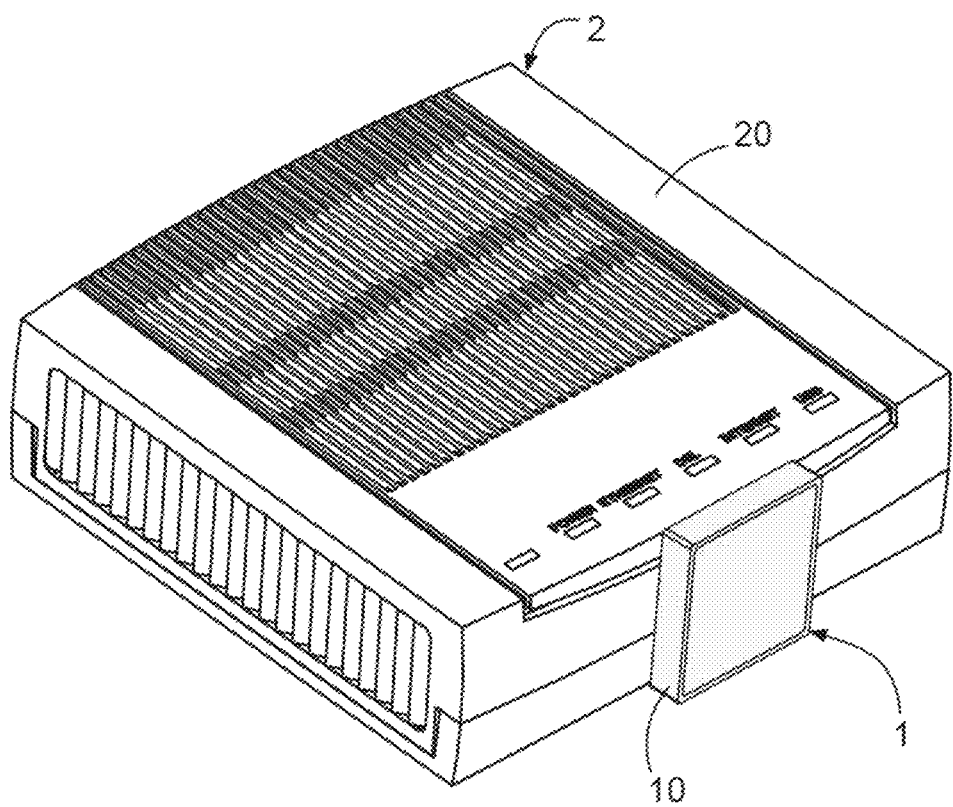
FIG. 3A shows a first stereo diagram of an electronic device having a millimeter-wave antenna device according to the present invention.
Figure 3B:
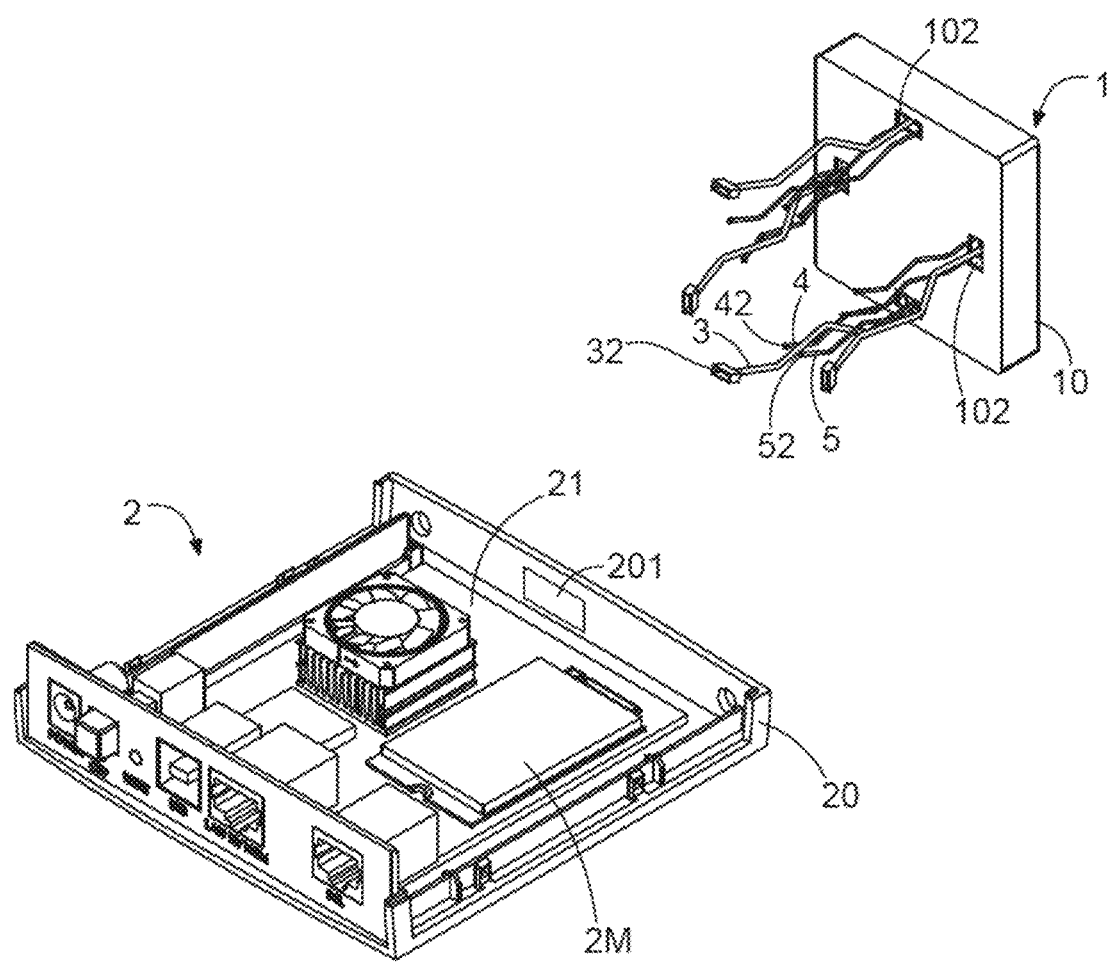
FIG. 3B shows a second stereo diagram of the electronic device having the millimeter-wave antenna device according to the present invention.
Figure 4:
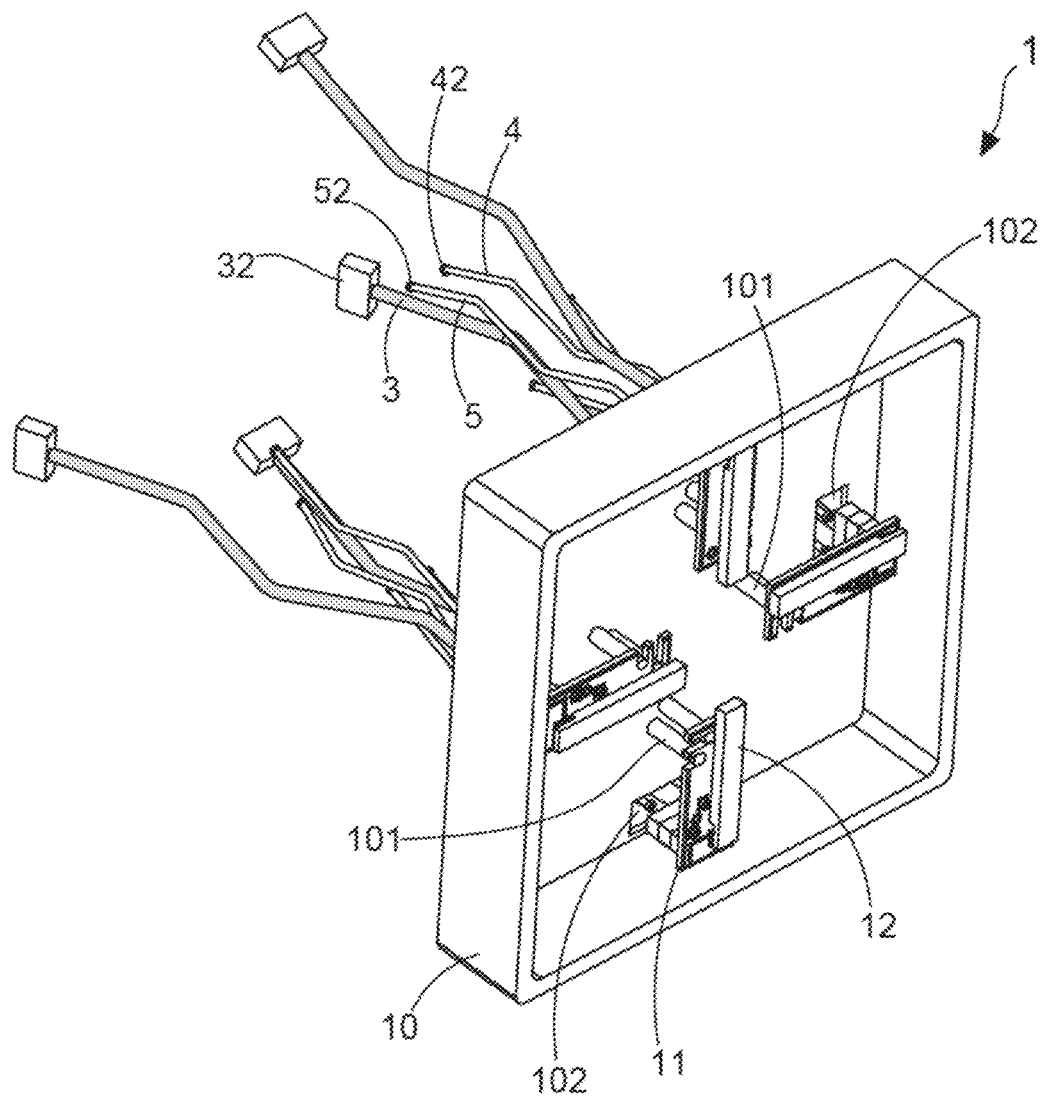
FIG. 4 shows a stereo diagram of the millimeter-wave antenna device according to the present invention.

With reference to FIG. 3A and FIG. 3B, there are shown a first stereo diagram and a second stereo diagram of an electronic device having a millimeter-wave antenna device according to the present invention. In addition, FIG. 4 shows a stereo diagram of the millimeter-wave antenna device according to the present invention. According to FIG. 3A, FIG. 3B and FIG. 4, the present invention discloses a millimeter-wave antenna device 1, which is adopted for being disposed at outside of an electronic device 2, being coupled to a wireless modem device 2M that is accommodated in a case 20 of the electronic device 2 through a first high-frequency (HF) transmission cable 4 and a second HF transmission cable 5, and being coupled to a main board 21 accommodated in the case 20 through a signal transmission cable 3.

In practicable embodiments, the electronic device 2 is a network appliance like Wi-Fi router, network switch, server computer, NB-IoT gateway, or network backup device. Moreover, according to the present invention, the millimeter-wave antenna device 1 comprises: a housing case 10, at least one bridge printed circuit board 11 and at least one millimeter-wave antenna module 12.

Figure 5:
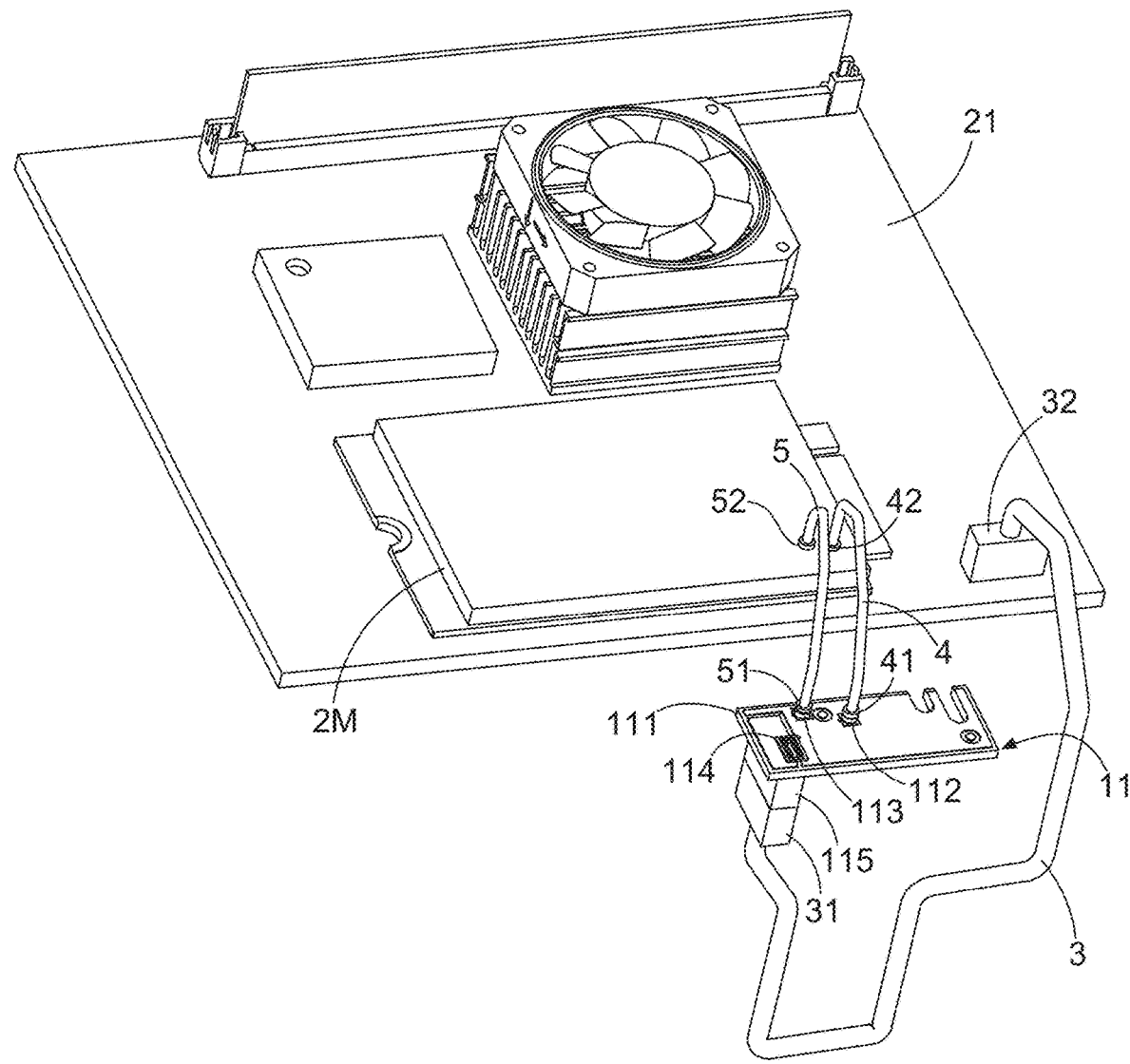
FIG. 5 shows a stereo diagram of a bridge printed circuit board, a wireless modem device and a main board.
Figure 6A:
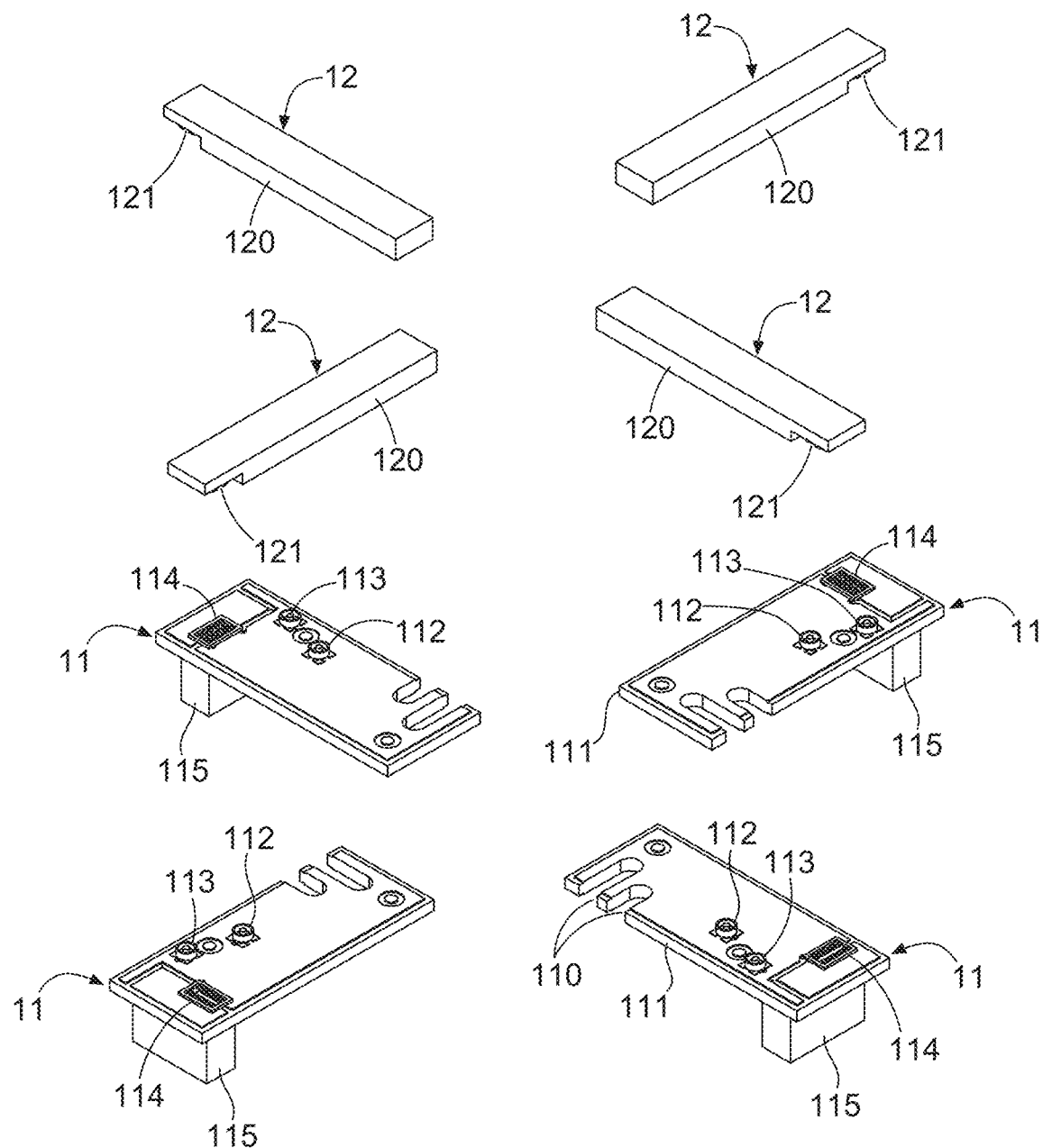
FIG. 6A shows a first stereo diagram of multiple bridge printed circuit boards and multiple millimeter-wave antenna modules.
Figure 6B:
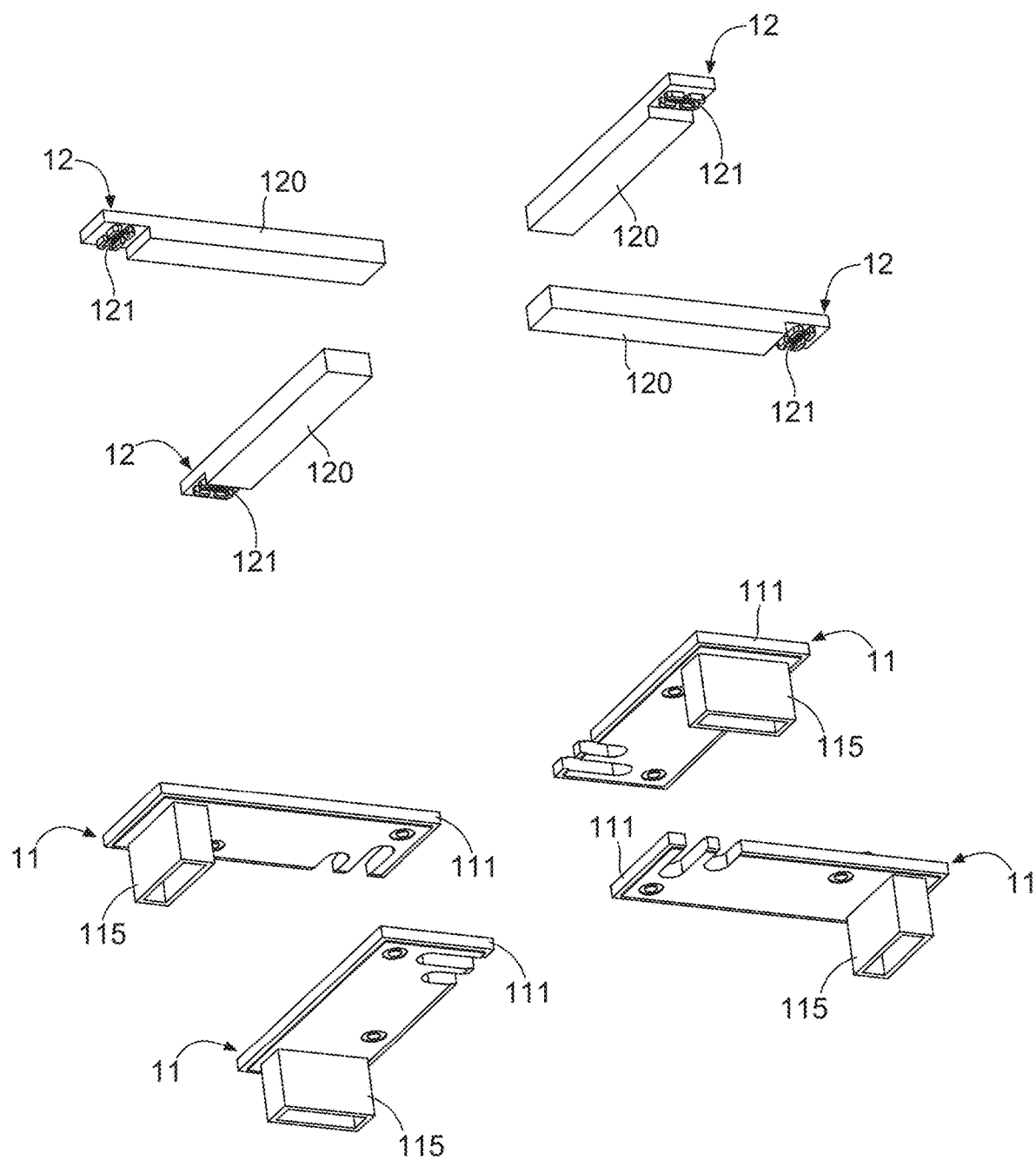
FIG. 6B shows a second stereo diagram of multiple bridge printed circuit boards and multiple millimeter-wave antenna modules.

FIG. 5 shows a stereo diagram of one bridge printed circuit board 11, one wireless modem device 12 and the main board 21. In addition, FIG. 6A and FIG. 6B show a first stereo diagram and a second stereo diagram of multiple bridge printed circuit boards 11 and multiple millimeter-wave antenna modules 12. As FIG. 4, FIG. 5, FIG. 6A, and FIG. 6B show, the multiple bridge printed circuit board 11 and the multiple millimeter-wave antenna module 12 are accommodated in the housing case 10, and there are multiple supporting members 101 disposed in the housing case to correspondingly support the bridge printed circuit boards 11. According to the present invention, each said bridge printed circuit board 11 comprises a substrate 111, wherein a first surface of the substrate 111 is disposed with a first HF signal transmission connector 112, a second HF signal transmission connector 113, a first antenna connector 114 and a first signal transmission connector 115 thereon. Moreover, the substrate 111 is further formed with a notch 110 for being engaged with the supporting member 101.

According to FIG. 4, FIG. 5, FIG. 6A, and FIG. 6B, it is found that the millimeter-wave antenna module 12 is the mmWave Antenna Module QTM525 proposed by Qualcomm company. Therefore, the millimeter-wave antenna module 12 comprises a second antenna connector 121 and a wireless transceiver circuit enclosed in an encapsulation body 120, of which the wireless transceiver circuit consists of a 5G transceiver, a power management chip, a radio frequency (RF) front end unit, and a phase-controlled antenna array.

Therefore, the wireless modem device 2M accommodated in the case 20 of the electronic device 2 can be successfully coupled to the millimeter-wave antenna module 12 through the bridge printed circuit board 11 by connecting the first antenna connector 114 to the second antenna connector 121 of the millimeter-wave antenna module 12, connecting the first signal transmission connector 115 to a second signal transmission connector 31 of the signal transmission cable 3, connecting a third signal transmission connector 32 of the signal transmission cable 3 to the main board 21 accommodated in the case 20 of the electronic device 2, connecting the first HF signal transmission connector 112 to a third HF signal transmission connector 41 of the first HF transmission cable 4, connecting a fourth HF signal transmission connector 42 of the first HF transmission cable 4 to the wireless modem device 2M, connecting the second HF signal transmission connector 113 to a fifth HF signal transmission connector 51 of the second HF transmission cable 5, and connecting a sixth HF signal transmission connector 52 of the second HF transmission cable 5 to the wireless modem device 2M.

As described in more detail below, there is at least one first opening 102 formed on one surface of the housing case 10, and the case 20 is also provided with at least one second opening 20 on one surface thereof. By such arrangements, the first HF transmission cable 4, the second HF transmission cable 5 and the signal transmission cable 3 are allowed to pass through the first opening 102 so as to be electrically connected with the bridge printed circuit board 11. Moreover, the first HF transmission cable 4, the second HF transmission cable 5 and the signal transmission cable 3 are also allowed to pass through the second opening 20 so as to be electrically connected with the wireless modem device 2M and the main board 21.

According to FIG. 3B and FIG. 3A, it is understood that the millimeter-wave antenna device 1 comprising at least one millimeter-wave antenna module 12 and at least one bridge printed circuit board 11 is disposed at outside of the electronic device 2, and is coupled to the wireless modem device 2M that is accommodated in the case 20 of the electronic device 2. Therefore, mmWave wireless signal fails to be blocked by the metal-made case 20 of the electronic device 2 in case the millimeter-wave antenna module 12 transceives the millimeter-wave signal. On the other hand, the first HF signal transmission connector 112 and the second HF signal transmission connector 113 to are coupled to the wireless modem device (chipset) 2M through the first HF transmission cable 5 and the second HF transmission cable 4, respectively. Moreover, the first signal transmission connector 115 is coupled to the main board 21 of the electronic device 2 through the signal transmission cable 3. By such arrangements, there is no need to use a particularly-designed flexible PCB to bridge the wireless modem device (chipset) 2M and the millimeter-wave antenna module 12. As a result, manufacturing cost of the millimeter-wave antenna device 1 and the electronic device (i.e., network appliance) using the millimeter-wave antenna device 1 is hence lowered.

Figure 7:
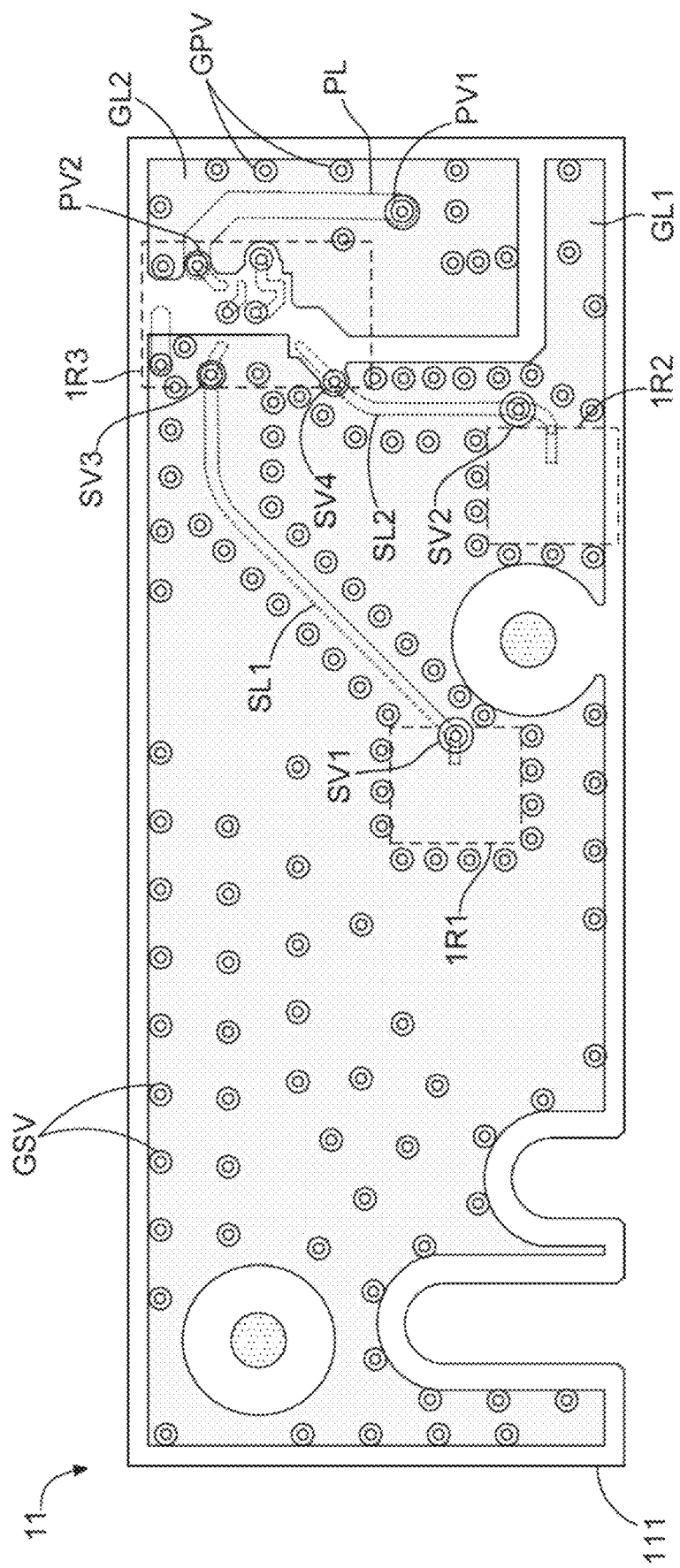
FIG. 7 shows a top view of the bridge printed circuit board.

FIG. 7 illustrates a top view if the bridge printed circuit board 11. As FIG. 7 shows, there are a first component disposing region 1R1, a second component disposing region 1R2 and a third component disposing region 1R3 provided on the first surface (e.g., top surface) of the substrate 111 of the bridge printed circuit board 11, and a fourth component disposing region 1R4 is formed on the second surface (e.g., bottom surface) of the substrate 111. Moreover, according to the particular design of the present invention, there are a first signal via SV1, a second signal via SV2, a third signal via SV3, a fourth signal via SV4, a first power via PV1, and a second power via PV2 penetrating the substrate 111. As described in more detail below, a first HF signal pin (i.e., pin "IF1") and a second HF signal pin (i.e., pin "IF2") of the millimeter-wave antenna module 12 (i.e., QTM525) are plugged into the third signal via SV3 and the fourth signal via SV4, respectively, and DC power pin (i.e., pin "$V_{DD}$") of the QTM525 is plugged into the second power via PV2. It is worth further explaining that, the QTM525 comprises a plurality of pins including the foregoing pin IF1, pin IF2 and pin $V_{DD}$, multiple grounding pins and multiple function pins.

As FIG. 7 shows, a first signal transmission line SL1 is formed on the second surface (i.e., bottom surface) of the substrate 111, and is coupled to the third signal via SV3 and the first signal via SV1. According to FIG. 7, it is understood that the first signal transmission line SL1 is depicted by dashed lines because it is formed on the bottom surface of the substrate 111. Moreover, a second signal transmission line SL2 is formed on the second surface of the substrate 111, and is coupled to the third signal via SV3 and the second signal via SV. On the other hand, a power transmission line PL is formed on the second surface of the substrate 111, and is coupled to the first power via PV1 and the second power via PV2.

As FIG. 5 and FIG. 7 show, the first high-frequency (HF) signal transmission connector 112 is disposed in the first component disposing region 1R1, and has a first HF transmission terminal plugged in the first signal via SV1, so as to be further coupled to the first signal transmission line SL1 through the first signal via SV1. Moreover, the second HF signal transmission connector 113 is disposed in the second component disposing region 1R2, and has a second HF transmission terminal plugged in the second signal via SV2, so as to be further coupled to the second signal transmission line SL2 through the second signal via SV2.

As described in more detail below, the first antenna connector 114 is disposed in the third component disposing region 1R3, and has a power terminal, a first HF terminal and a second HF terminal plugged in the second power via PV1, the third signal via SV3 and the fourth signal via SV4, respectively. It should be understood that, the first antenna connector 114 is adopted for being connected with the second antenna connector 121 of the millimeter-wave antenna module 12. Therefore, after the second antenna connector 121 is engaged with first antenna connector 114, the pin $V_{DD}$, pin IF1 and pin IF2 of the second antenna connector 121 are electrically connected with power terminal, the first HF terminal and the second HF terminal of the first antenna connector 114, respectively, so as to be correspondingly coupled to the second power via PV1 the third signal via SV3 and the fourth signal via SV4.

On the other hand, the first signal transmission connector 115 is disposed in the fourth component disposing region 1R4, and has a power transmission terminal plugged in the first power via PV1, so as to be further coupled to the first power via PV1 through the power transmission line PL. As described in more detail below, the first signal transmission connector 115 is coupled to the main board 21 of the electronic device 2 through the signal transmission cable 3, such that the first signal transmission connector 115 receives power from the main board 21, and then transmits the power to the bridge printed circuit board 11, thereby simultaneously powering the millimeter-wave antenna module 12.

Furthermore, there are further a plurality of first vias GSV and a plurality of second vias GPV penetrating the substrate 111. In addition, the first surface of the substrate 111 is formed with a first ground layer GL1 connected with the first vias GSV and a second ground layer GL2 connected with the second vias GPV thereon. Moreover, the second surface of the substrate 111 is also formed with at least one ground layer. Therefore, as FIG. 7 shows, a first amount of said first vias GSV are arranged to surround the first signal transmission line SL1, a second amount of said first vias GSV are arranged to surround the second signal transmission line SL2, a third amount of said first vias GSV are arranged to surround the first component disposing region 1R1, and a fourth amount of said first vias GSV are arranged to surround the second component disposing region 1R2.

In a practicable embodiment, the first antenna connector 114 is accommodated in a grounding housing, and the grounding housing contacts with the first ground layer GL1 and the second ground layer GL2 by a bottom side thereof. In other words, the grounding housing, the first ground layer GL1 and the second ground layer GL2 are commonly grounded. It is worth further explaining that, the first antenna connector 114 comprises a plurality of terminals including said power terminal, said first HF terminal and said second HF terminal. After being disposed on the substrate 111, a part of the plurality of terminals contact with the first ground layer GL1, and the other part of the plurality of terminals contacting with the second ground layer GL2.

Figure 8:
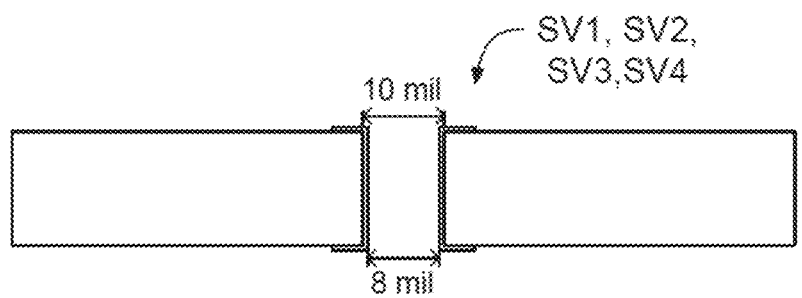
FIG. 8 shows a cross-sectional view of a plating through hole (PTH) without annular ring.

In addition, for reducing the insertion loss, the first signal via SV1, the second signal via SV2, the third signal via SV3, the fourth signal via SV4 are all a plating through hole (PTH) without annular ring. FIG. 8 shows a cross-sectional view of a plating through hole (PTH) without annular ring. According to FIG. 8, each of the first signal via SV1, the second signal via SV2, the third signal via SV3, the fourth signal via SV4 has an inside diameter of 8 mils and an outside diameter of 10 mils. In other words, there is a copper layer with 1 mil thinness formed on the inner wall of the plating through hole (SV1, SV2, SV3, SV4).

Figure 9:
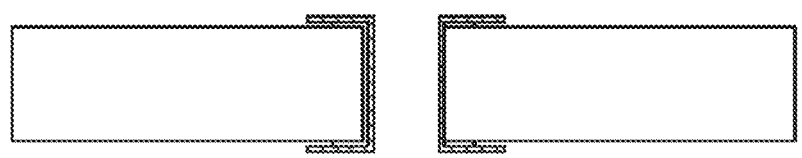
FIG. 9 shows a cross-sectional view of a PTH with annular ring.

Differing from the first signal via SV1, the other vias are all a plating through hole (PTH) with annular ring, for example, the multiple ground vias for connecting the multiple ground terminals of the first antenna connector 114. FIG. 9 shows a cross-sectional view of a plating through hole (PTH) with annular ring. According to FIG. 9, each said ground via is inserted with an annular ring, and has an outside diameter that is great than 16 mils. Moreover, there is a copper layer formed on the inner wall of the ground via.

Experiment Data

Figure 10:
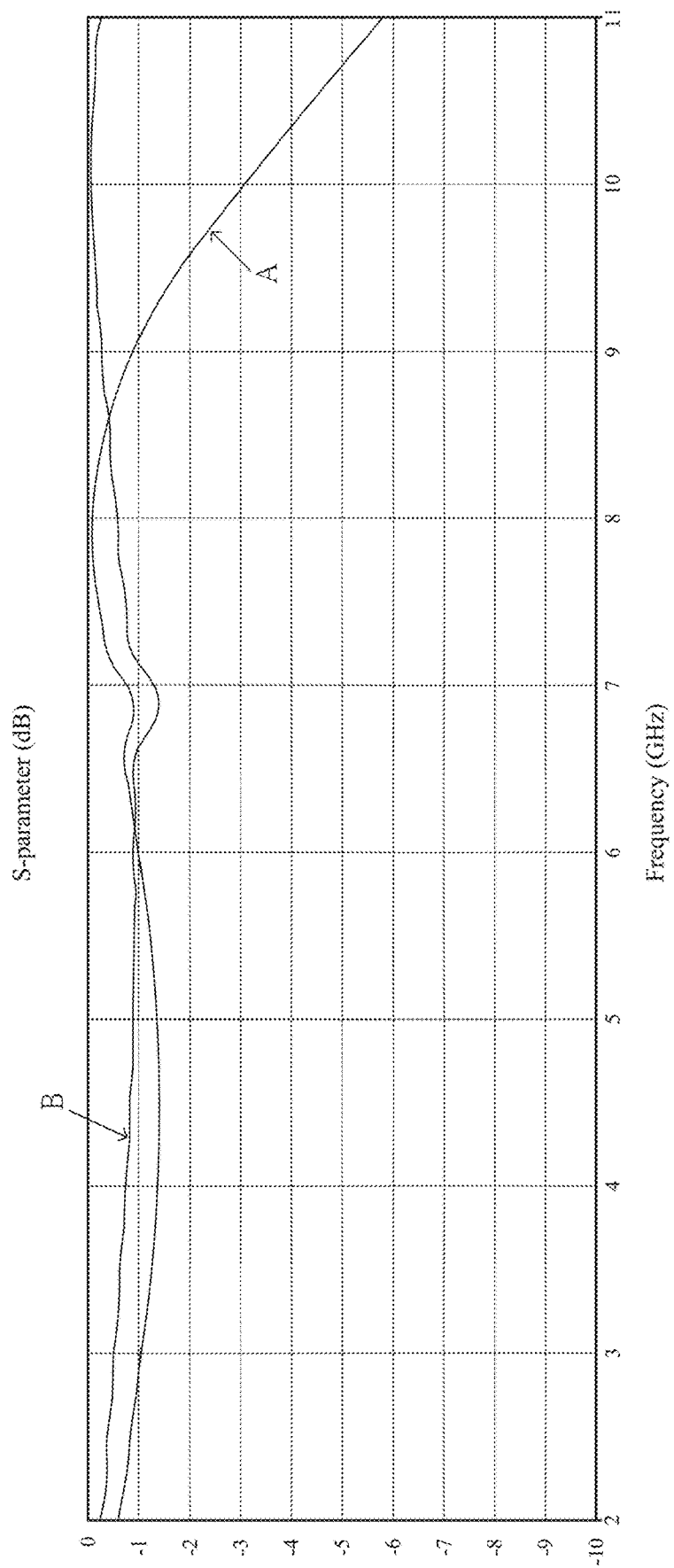
FIG. 10 shows a measured S-parameter graph.

Please refer to FIG. 7 again, and simultaneously refer to FIG. 10 showing a measured S-parameter graph. It needs to explain that, the S-parameter data are measured from the second signal via SV2 and the fourth signal via SV4, in which data curve A is measured in case the second signal via SV2 and the fourth signal via SV4 are both a plating through hole (PTH) with annular ring. On the contrary, data curve B is measured in case the second signal via SV2 and the fourth signal via SV4 are both a PTH without annular ring. According to data curve B and data curve A, it is able to find that, the insertion loss between the second signal via SV2 and the fourth signal via SV4 gets a significant improvement in case of the second signal via SV2 and the fourth signal via SV4 being both a PTH without annular ring.

Figure 11:
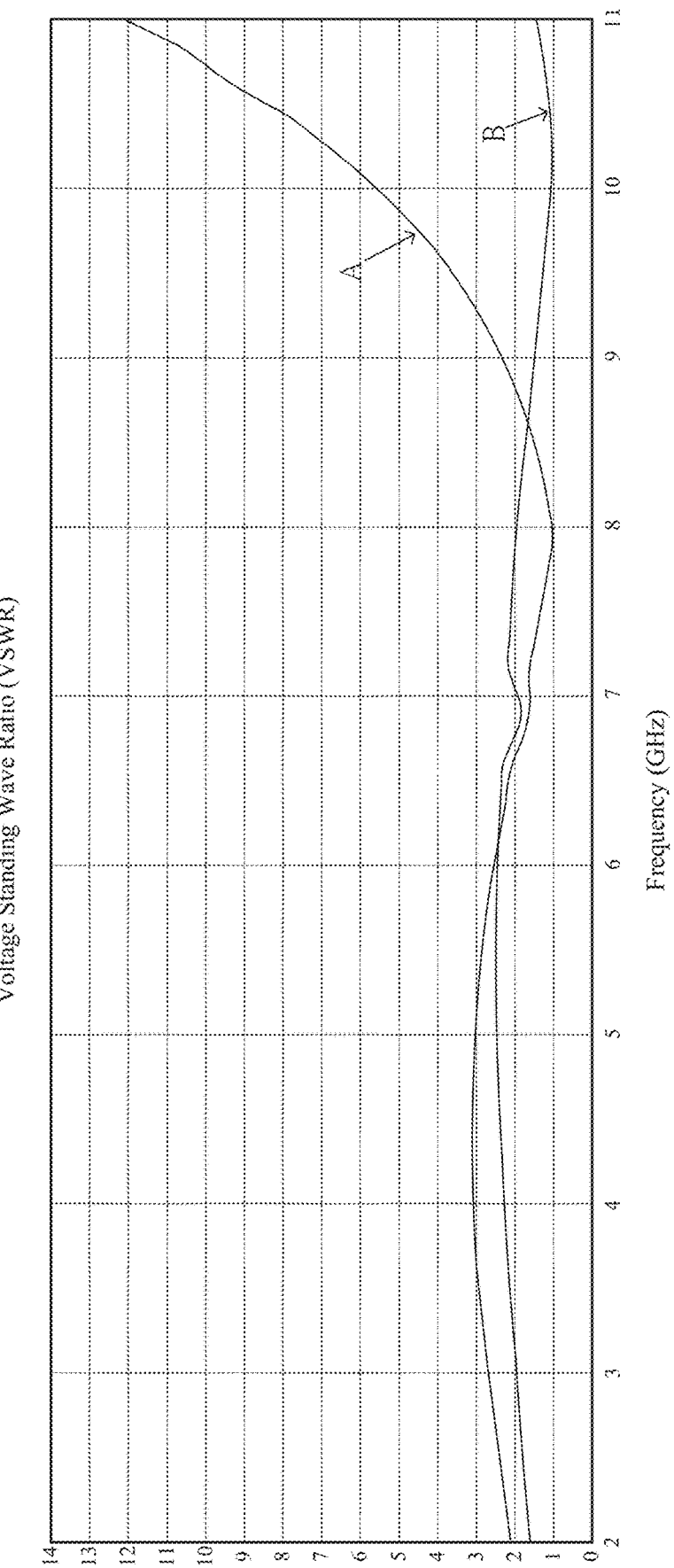
FIG. 11 shows a measured VSWR graph.

Next, FIG. 11 shows a measured VSWR graph. It needs to explain that, VSWR means voltage standing wave ratio, and the VSWR data are measured during the fact that a HF signal is transmitted between the second signal via SV2, the second signal transmission line SL2 and the fourth signal via SV4. In FIG. 11 data curve A is measured in case the second signal via SV2 and the fourth signal via SV4 are both a plating through hole (PTH) with annular ring. On the contrary, data curve B is measured in case the second signal via SV2 and the fourth signal via SV4 are both a PTH without annular ring. According to data curve B and data curve A, it is able to find that, the VSWR has a good performance in case of the second signal via SV2 and the fourth signal via SV4 being both a PTH without annular ring.

Figure 12:
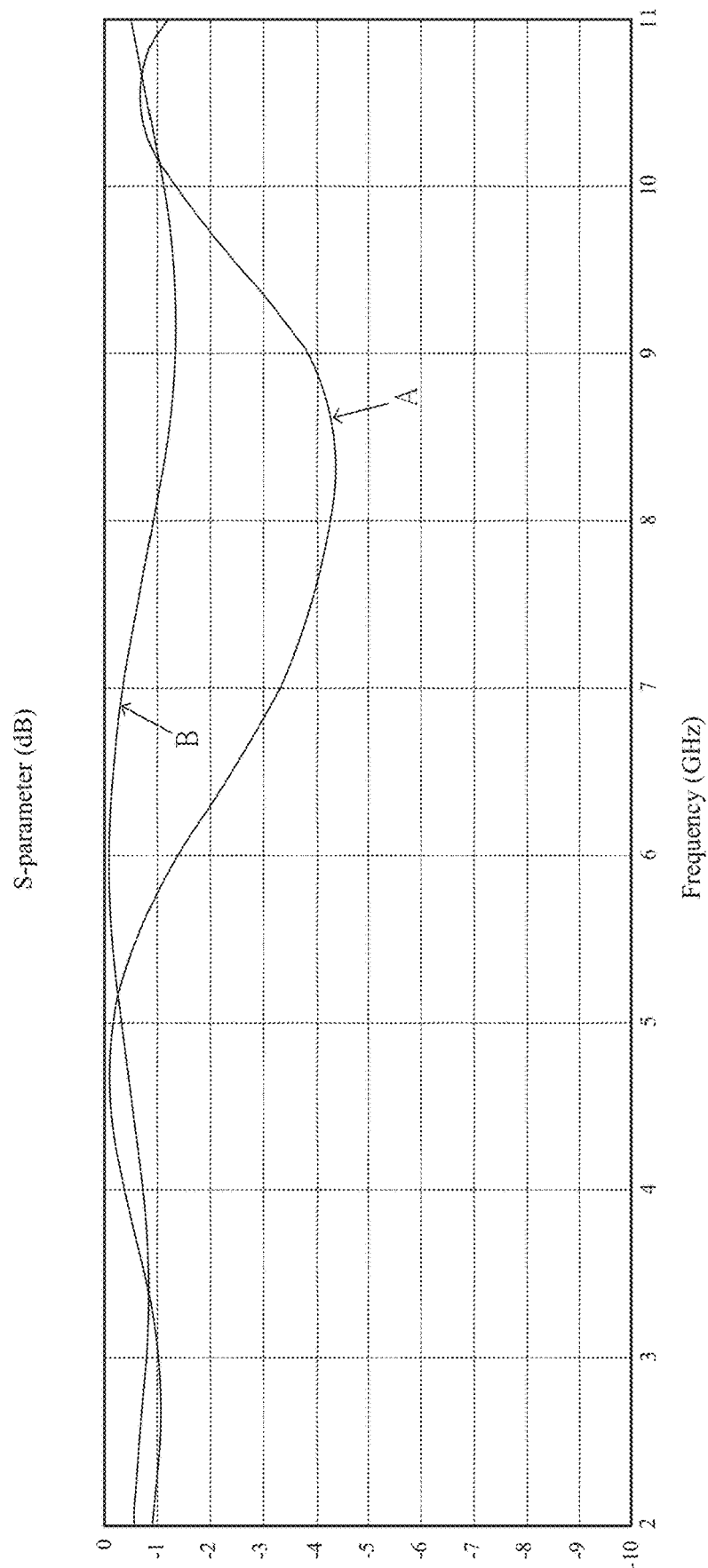
FIG. 12 shows a measured S-parameter graph.

Please refer to FIG. 7 again, and simultaneously refer to FIG. 12 showing a measured S-parameter graph. It needs to explain that, the S-parameter data are measured from the first signal via SV1 and the third signal via SV3, in which data curve A is measured in case the first signal via SV1 and the third signal via SV3 are both a plating through hole (PTH) with annular ring. On the contrary, data curve B is measured in case the first signal via SV1 and the third signal via SV3 are both a PTH without annular ring. According to data curve B and data curve A, it is able to find that, the insertion loss between the first signal via SV1 and the third signal via SV3 gets a significant improvement in case of the first signal via SV1 and the third signal via SV3 being both a PTH without annular ring.

Figure 13:
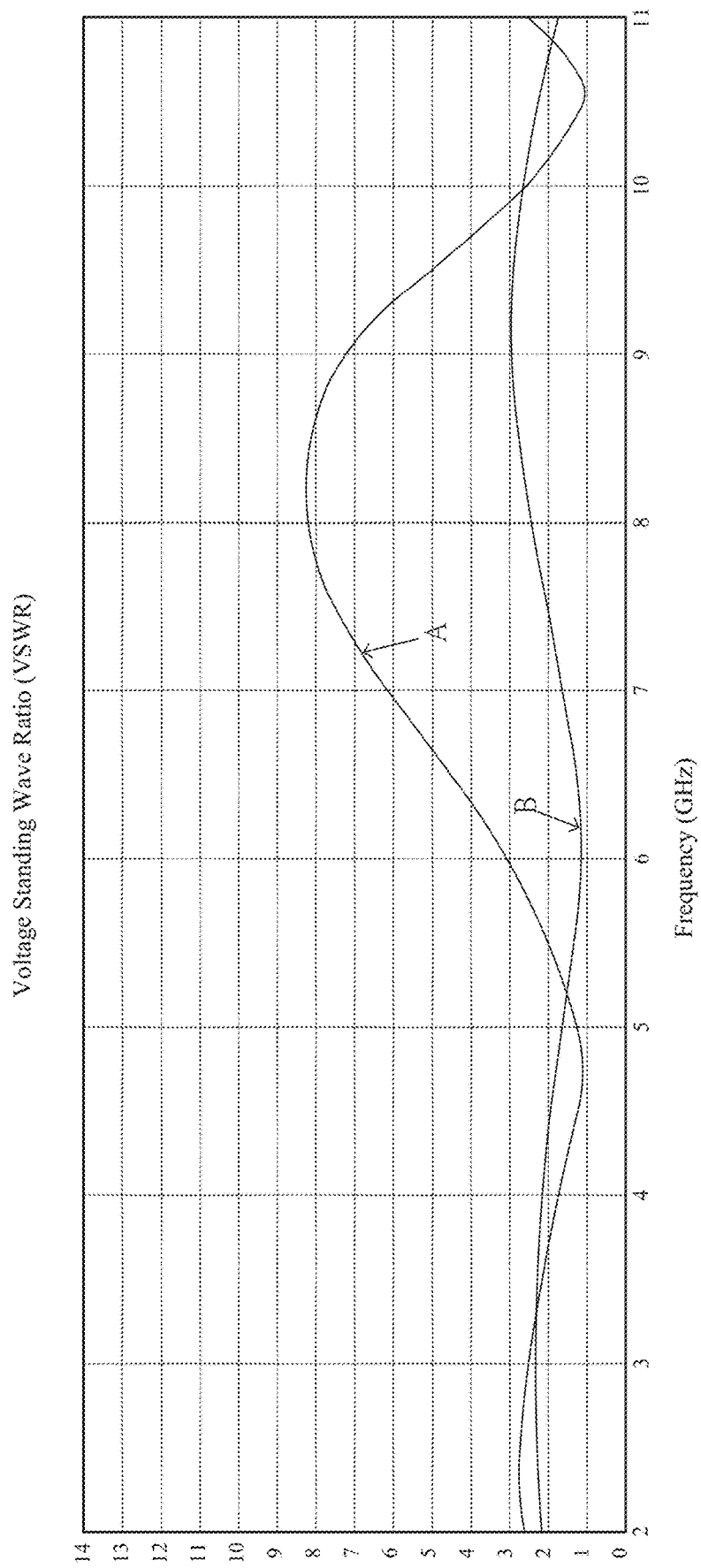
FIG. 13 shows a measured VSWR graph.

Next, FIG. 13 shows a measured VSWR graph. It needs to explain that, VSWR means voltage standing wave ratio, and the VSWR data are measured during the fact that a HF signal is transmitted between the first signal via SV1, the first signal transmission line SL1 and the third signal via SV3. In FIG. 13 data curve A is measured in case the first signal via SV1 and the third signal via SV3 are both a plating through hole (PTH) with annular ring. On the contrary, data curve B is measured in case the first signal via SV1 and the third signal via SV3 are both a PTH without annular ring. According to data curve B and data curve A, it is able to find that, the VSWR has a good performance in case of the first signal via SV1 and the third signal via SV3 being both a PTH without annular ring.

Therefore, through the above descriptions, all embodiments of the bridge printed circuit board, the millimeter-wave antenna device and the electronic device according to the present invention have been introduced completely and clearly. It is worth emphasizing that, the above description is made on embodiments of the present invention. However, the embodiments are not intended to limit the scope of the present invention, and all equivalent implementations or alterations within the spirit of the present invention still fall within the scope of the present invention.

What is claimed is:

1. A bridge printed circuit board, being adopted for being coupled between a wireless modem device that is accommodated in a case of an electronic device and a millimeter-wave antenna module that is disposed at outside of the electronic device, and comprising:

a substrate, being provided with a first component disposing region, a second component disposing region and a third component disposing region on a first surface thereof, and having a fourth component disposing region on a second surface thereof; wherein there are a first signal via, a second signal via, a third signal via, a fourth signal via, a first power via, and a second power via penetrating the substrate;

a first signal transmission line, being formed on the second surface of the substrate, and being coupled to the third signal via and the first signal via;

a second signal transmission line, being formed on the second surface of the substrate, and being coupled to the third signal via and the second signal via;

a power transmission line, being formed on the second surface of the substrate, and being coupled to the first power via and the second power via;

a first high-frequency (HF) signal transmission connector, being disposed in the first component disposing region, and having a first HF transmission terminal plugged in the first signal via, so as to be further coupled to the first signal transmission line through the first signal via;

a second HF signal transmission connector, being disposed in the second component disposing region, and having a second HF transmission terminal plugged in the second signal via, so as to be further coupled to the second signal transmission line through the second signal via;

a first signal transmission connector, being disposed in the fourth component disposing region, and having a power transmission terminal plugged in the first power via; and a first antenna connector, being disposed in the third component disposing region, and having a power terminal, a first HF terminal and a second HF terminal plugged in the second power via, the third signal via and the fourth signal via, respectively;

wherein the wireless modem device accommodated in the case of the electronic device is successfully coupled to the millimeter-wave antenna module through the bridge printed circuit board by connecting the first antenna connector to a second antenna connector of the millimeter-wave antenna module, connecting the first signal transmission connector to a second signal transmission connector of a signal transmission cable, connecting a third signal transmission connector of the signal transmission cable to a main board accommodated in the case of the electronic device, connecting the first HF signal transmission connector to a third HF signal transmission connector of a first HF transmission cable, connecting a fourth HF signal transmission connector of the first HF transmission cable to the wireless modem device accommodated in the case of the electronic device, connecting the second HF signal transmission connector to a fifth HF signal transmission connector of a second HF transmission cable, and connecting a sixth HF signal transmission connector of the second HF transmission cable to the wireless modem device accommodated in the case of the electronic device.

2. The bridge printed circuit board of claim 1, wherein there are further a plurality of first vias and a plurality of second vias penetrating the substrate.

3. The bridge printed circuit board of claim 2, wherein the first surface of the substrate is formed with a first ground layer connected with the first vias and a second ground layer connected with the second vias thereon.

4. The bridge printed circuit board of claim 2, wherein the second surface of the substrate is formed with at least one ground layer.

5. The bridge printed circuit board of claim 3, wherein the first antenna connector is accommodated in a grounding housing, and the grounding housing contacting with the first ground layer and the second ground layer by a bottom side thereof.

6. The bridge printed circuit board of claim 3, wherein a first amount of said first vias are arranged to surround the first signal transmission line, a second amount of said first vias being arranged to surround the second signal transmission line, a third amount of said first vias being arranged to surround the first component disposing region, and a fourth amount of said first vias being arranged to surround the second component disposing region.

7. The bridge printed circuit board of claim 3, wherein the first antenna connector comprises a plurality of terminals including said power terminal, said first HF terminal and said second HF terminal, wherein a part of the plurality of terminals contact with the first ground layer, and the other part of the plurality of terminals contacting with the second ground layer.

8. The bridge printed circuit board of claim 3, wherein the first signal via, the second signal via, the third signal via, the fourth signal via are all a plating through hole (PTH).

9. A millimeter-wave antenna device 1, being adopted for being disposed at outside of an electronic device, being coupled to a wireless modem device that is accommodated in a case of the electronic device through a first high-frequency (HF) transmission cable and a second HF transmission cable, and being coupled to a main board accommodated in the case through a signal transmission cable; wherein the millimeter-wave antenna device comprises:
at least one bridge printed circuit board, comprising a substrate provided with a first HF signal transmission connector, a second HF signal transmission connector, a first antenna connector and a first signal transmission connector thereon; and
at least one millimeter-wave antenna module, having a second antenna connector, and being disposed on the bridge printed circuit board by connecting the second antenna connector with the first antenna connector;
wherein the first signal transmission connector is connected to a second signal transmission connector of the signal transmission cable, and a third signal transmission connector of the signal transmission cable being connected to the main board;
wherein the first HF signal transmission connector is connected to a third HF signal transmission connector of the first HF transmission cable, and a fourth HF signal transmission connector of the first HF transmission cable being connected to the wireless modem device;
wherein the second HF signal transmission connector is connected to a fifth HF signal transmission connector of the second HF transmission cable, and a sixth HF signal transmission connector of the second HF transmission cable being connected to the wireless modem device.

10. The millimeter-wave antenna device of claim 9, further comprising a housing case for accommodating the bridge printed circuit board and the millimeter-wave antenna module, and there is at least one supporting member disposed in the housing case to support the bridge printed circuit board.

11. The millimeter-wave antenna device of claim 10, wherein there is at least one first opening formed on one surface of the housing case, and the case being also provided with at least one second opening on one surface thereof, such that the first HF transmission cable, the second HF transmission cable and the signal transmission cable pass through the first opening so as to contact with the bridge printed circuit board, and also pass through the second opening so as to contact with the wireless modem device and the main board.

12. The millimeter-wave antenna device of claim 10, wherein the substrate comprises:
a first surface, being provided with a first component disposing region, a second component disposing region and a third component disposing region thereon;
a second surface, being provided with fourth component disposing region, a first signal transmission line, a second signal transmission line, and a power transmission line thereon;
wherein there are a first signal via, a second signal via, a third signal via, a fourth signal via, a first power via, and a second power via penetrating the substrate, such that the first signal transmission line is coupled to the third signal via and the first signal via, the second signal transmission line being coupled to the third signal via and the second signal via, and the power transmission line being coupled to the first power via and the second power via;
wherein the first high-frequency (HF) signal transmission connector is disposed in the first component disposing region, and having a first HF transmission terminal plugged in the first signal via, so as to be further coupled to the first signal transmission line through the first signal via;
wherein the second HF signal transmission connector is disposed in the second component disposing region, and having a second HF transmission terminal plugged in the second signal via, so as to be further coupled to the second signal transmission line through the second signal via;
wherein the first signal transmission connector is disposed in the fourth component disposing region, and having a power transmission terminal plugged in the first power via;
wherein the first antenna connector is disposed in the third component disposing region, and having a power terminal, a first HF terminal and a second HF terminal plugged in the second power via, the third signal via and the fourth signal via, respectively.

13. The bridge printed circuit board of claim 12, wherein there are further a plurality of first vias and a plurality of second vias penetrating the substrate.

14. The bridge printed circuit board of claim 12, wherein the first surface of the substrate is formed with a first ground layer connected with the first vias and a second ground layer connected with the second vias thereon.

15. The bridge printed circuit board of claim 12, wherein the second surface of the substrate is formed with at least one ground layer.

16. The bridge printed circuit board of claim 14, wherein the first antenna connector is accommodated in a grounding housing, and the grounding housing contacting with the first ground layer and the second ground layer by a bottom side thereof.

17. The bridge printed circuit board of claim 14, wherein a first amount of said first vias are arranged to surround the first signal transmission line, a second amount of said first vias being arranged to surround the second signal transmission line, a third amount of said first vias being arranged to surround the first component disposing region, and a fourth amount of said first vias being arranged to surround the second component disposing region.

18. The bridge printed circuit board of claim 12, wherein the first signal via, the second signal via, the third signal via, the fourth signal via are all a plating through hole (PTH).

19. An electronic device, comprising a case that is accommodated a main board and a wireless modem device therein, characterized in that the electronic device further has a millimeter-wave antenna device that is arranged for being disposed at outside of an electronic device, being coupled to the wireless modem device through a first high-frequency (HF) transmission cable and a second HF transmission cable, and being coupled to the main board through a signal transmission cable; wherein the millimeter-wave antenna device comprises:

at least one bridge printed circuit board, comprising a substrate provided with a first HF signal transmission connector, a second HF signal transmission connector, a first antenna connector and a first signal transmission connector thereon; and at least one millimeter-wave antenna module, having a second antenna connector, and being disposed on the bridge printed circuit board by connecting second antenna connector with the first antenna connector;

wherein the first signal transmission connector is connected to a second signal transmission connector of the signal transmission cable, and a third signal transmission connector of the signal transmission cable being connected to the main board;

wherein the first HF signal transmission connector is connected to a third HF signal transmission connector of the first HF transmission cable, and a fourth HF signal transmission connector of the first HF transmission cable being connected to the wireless modem device;

wherein the second HF signal transmission connector is connected to a fifth HF signal transmission connector of the second HF transmission cable, and a sixth HF signal transmission connector of the second HF transmission cable being connected to the wireless modem device.

20. The electronic device of claim 19, wherein the electronic device is a network appliance selected from a group consisting of Wi-Fi router, network switch, server computer, NB-IoT gateway, and network backup device.

* * * * *